(12) United States Patent
Lee

(10) Patent No.: US 9,190,567 B2
(45) Date of Patent: *Nov. 17, 2015

(54) NITRIDE SEMICONDUCTOR LIGHT EMITTING DEVICE AND FABRICATION METHOD THEREOF

(71) Applicant: LG INNOTEK CO., LTD., Seoul (KR)

(72) Inventor: Suk Hun Lee, Gwangju-si (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/604,133

(22) Filed: Jan. 23, 2015

(65) Prior Publication Data

US 2015/0137071 A1    May 21, 2015

Related U.S. Application Data

(63) Continuation of application No. 14/201,883, filed on Mar. 9, 2014, now Pat. No. 8,969,849, which is a continuation of application No. 13/585,451, filed on Aug. 14, 2012, now Pat. No. 8,674,340, which is a continuation of application No. 12/849,265, filed on Aug. 3, 2010, now Pat. No. 8,278,646, which is a continuation of application No. 11/719,929, filed as application No. PCT/KR2005/004120 on Dec. 5, 2005, now Pat. No. 7,791,062.

(30) Foreign Application Priority Data

Dec. 23, 2004 (KR) .................. 10-2004-0111087

(51) Int. Cl.
| | |
|---|---|
| *H01L 29/06* | (2006.01) |
| *H01L 33/14* | (2010.01) |
| *H01L 33/02* | (2010.01) |
| *H01L 33/32* | (2010.01) |
| *H01L 33/06* | (2010.01) |
| *H01L 33/30* | (2010.01) |
| *H01L 27/15* | (2006.01) |

(52) U.S. Cl.
CPC .............. *H01L 33/14* (2013.01); *H01L 33/02* (2013.01); *H01L 33/06* (2013.01); *H01L 33/305* (2013.01); *H01L 33/32* (2013.01); *H01L 27/15* (2013.01); *H01L 33/025* (2013.01)

(58) Field of Classification Search
None
See application file for complete search history.

(56) References Cited

U.S. PATENT DOCUMENTS

| 6,172,382 B1 | 1/2001 | Nagahama et al. |
| 6,242,761 B1 | 6/2001 | Fujimoto et al. |

(Continued)

FOREIGN PATENT DOCUMENTS

| EP | 1017113 A1 | 7/2000 |
| EP | 1063711 A1 | 12/2000 |

(Continued)

OTHER PUBLICATIONS

Office Action dated Jun. 6, 2008 in Chinese Application No. 200580040963.3, filed Dec. 5, 2005.

(Continued)

*Primary Examiner* — Kyoung Lee
(74) *Attorney, Agent, or Firm* — Saliwanchik, Lloyd & Eisenschenk

(57) ABSTRACT

Provided is a nitride semiconductor light emitting device including: a first nitride semiconductor layer; an active layer formed above the first nitride semiconductor layer; and a delta doped second nitride semiconductor layer formed above the active layer. According to the present invention, the optical power of the nitride semiconductor light emitting device is enhanced, optical power down phenomenon is improved and reliability against ESD (electro static discharge) is enhanced.

19 Claims, 4 Drawing Sheets

(56) References Cited

U.S. PATENT DOCUMENTS

| | | |
|---|---|---|
| 6,479,836 B1 | 11/2002 | Suzuki et al. |
| 6,586,774 B2 * | 7/2003 | Ishibashi et al. ............... 257/94 |
| 6,833,564 B2 | 12/2004 | Shen et al. |
| 8,278,646 B2 * | 10/2012 | Lee .................... 257/13 |
| 2002/0096687 A1 | 7/2002 | Kuo et al. |
| 2003/0178633 A1 | 9/2003 | Flynn et al. |
| 2003/0205736 A1 | 11/2003 | Kozaki |
| 2004/0235212 A1 * | 11/2004 | Ishizaki .................. 438/46 |
| 2005/0006651 A1 | 1/2005 | Le Boeuf et al. |
| 2005/0104080 A1 | 5/2005 | Ichihara et al. |
| 2005/0121679 A1 * | 6/2005 | Nagahama et al. ............ 257/94 |

FOREIGN PATENT DOCUMENTS

| | | |
|---|---|---|
| EP | 1221723 A2 | 7/2002 |
| EP | 1403932 A1 | 3/2004 |
| JP | 08-213651 A | 8/1996 |
| JP | 11-054796 A | 2/1999 |
| JP | 2000-164922 A | 6/2000 |
| JP | 2003-152219 A | 5/2003 |
| JP | 2005-229132 A | 8/2005 |
| JP | 2005-252309 A | 9/2005 |
| JP | 2005-277403 A | 10/2005 |
| KR | 10-2000-0061358 A | 10/2000 |
| KR | 10-2000-0065567 A | 11/2000 |
| KR | 10-2002-0021247 A | 3/2002 |
| KR | 10-2002-0079659 A | 10/2002 |
| WO | WO-00/58999 A2 | 10/2000 |
| WO | WO-02/23640 A1 | 3/2002 |
| WO | WO-02/45223 A1 | 6/2002 |
| WO | WO-2004/017431 A1 | 2/2004 |

OTHER PUBLICATIONS

Kim, K. H. et al. "Ill-nitride Ultraviolet Light-Emitting Diodes with Delta Doping", *Applied Physics Letters*, Jul. 21, 2003, vol. 83, No. 3.

Nakarmi et al. "Enhanced p-type Conduction in GaN and AlGaN by Mg-delata-doping" *Applied Physics Letters*, May 5, 2003, pp. 3041-3043, vol. 82, No. 18.

European Search Report dated Jun. 6, 2011 in European Application No. 10191954.6, filed Dec. 5, 2005.

Japanese Office Action dated Mar. 13, 2012 in Japanese Application No. 171838.

Wen, T.C. et al. "Nitride-Based LEDs With Modulation-Doped $Al_{0.12}Ga_{0.88}N$-GaN Superlattice Structures" *IEEE Transactions on Electron Devices*, Oct. 2004, 51(10):1743-1746.

Asano, T. et al. "100-mK Kink-Free Blue-Violet Laser Diodes With Low Aspect Ratio" *IEEE Journal of Quantum Electronics*, Jan. 2003, 39(1):135-140.

European Search Report dated Mar. 6, 2013 in European Application No. 10191954.6, filed Dec. 5, 2005.

Partial European Search Report dated Mar. 7, 2013 in European Application No. 10191955.3, filed Dec. 5, 2005.

Office Action dated Aug. 13, 2013 in Japanese Application No. 2012-155208, filed Jul. 11, 2012.

Japanese Appeal Decision dated Mar. 24, 2015 in Japanese Application No. 2014-9243.

\* cited by examiner

NITRIDE SEMICONDUCTOR LIGHT EMITTING DEVICE AND FABRICATION METHOD THEREOF

CROSS-REFERENCE TO RELATED APPLICATIONS

This application is a continuation of U.S. application Ser. No. 14/201,883, filed Mar. 9, 2014; which is a continuation of U.S. application Ser. No. 13/585,451, filed Aug. 14, 2012, now U.S. Pat. No. 8,674,340, issued Mar. 18, 2014; which is a continuation of U.S. application Ser. No. 12/849,265, filed Aug. 3, 2010, now U.S. Pat. No. 8,278,646, issued Oct. 2, 2012; which is a continuation of U.S. application Ser. No. 11/719,929, filed May 22, 2007, now U.S. Pat. No. 7,791,062, issued Sep. 7, 2010; which is the U.S. national stage application of International Patent Application No. PCT/KR2005/004120, filed Dec. 5, 2005; which claims priority to Korean Patent Application No. 10-2004-0111087, filed Dec. 23, 2004, all of which are incorporated herein by reference in their entirety.

BACKGROUND

1. Technical Field

The present invention is relative to a nitride semiconductor light emitting device and fabrication method thereof, and to a nitride semiconductor light emitting device and a fabrication method thereof that can increase the optical power and enhance the reliability by increasing a hole carrier concentration contributing to the electric conductivity in an electrode contact layer to increase the recombination probability of electrons and holes.

2. Background Art

A schematic stack structure of a general nitride semiconductor light emitting device and a fabrication method thereof will now be described.

FIG. 1 is a sectional view of a general nitride semiconductor light emitting device.

Referring to FIG. 1, a conventional nitride semiconductor light emitting device includes a substrate 101, a buffer layer 103, an n-GaN layer 105, an active layer 107 and a p-GaN layer 109. Herein, the substrate 101 can be exemplified by a sapphire substrate.

A fabrication method of the nitride semiconductor light emitting device will now be described. In order to minimize the occurrence of crystal defects due to differences in the lattice constants and the thermal expansion coefficients of the substrate 101 and the n-GaN layer 105, a GaN-based nitride or an AlN-based nitride having an amorphous phase at a low temperature is formed as the buffer layer 103.

The n-GaN layer 105 doped with silicon at a doping concentration of $10^{18}/cm^3$ is formed at a high temperature as a first electrode contact layer. Thereafter, the growth temperature is lowered and the active layer 107 is formed. Thereafter, the growth temperature is again elevated and the p-GaN layer 109 doped with magnesium (Mg) and having a thickness range of 0.1-0.5 µm is formed as a second electrode contact layer. The nitride semiconductor light emitting device having the aforementioned stack structure is formed in a p-/n-junction structure which uses the n-GaN layer 105 as the first electrode contact layer and uses the p-GaN layer 109 as the second electrode contact layer.

Also, a second electrode material formed on the second electrode contact layer is limited depending on a doping type of the second electrode contact layer. For example, in order to decrease the contact resistance between the second contact material and the p-GaN layer 109 having a high resistance component and enhance the current spreading, a thin transmissive resistance material of a Ni/Au alloy is used as the second electrode material.

To form the p-GaN layer 109 used as the second electrode contact layer, the p-/n-junction light emitting device using the nitride semiconductor employs a doping source of $Cp_2Mg$ or DMZn. In the case of DMZn, since Zn is in 'deep energy level' within the p-GaN layer 109 and has a very high activation energy, the hole carrier concentration serving as a carrier when a bias is applied is limited to about $1 \times 10^{17}/cm^3$. Accordingly, $Cp_2Mg$ MO (metal organic) having a low activation energy is used as the doping source.

Also, when the Mg-doped p-GaN layer 109 having a thickness range of 0.1-0.5 µm is grown using a doping source of $Cp_2Mg$ at the same flow rate or by sequentially varying the flow rate of $Cp_2Mg$, hydrogen (H) gas separated from the doping source and $NH_3$ carrier gas are combined to form an Mg—H complex, in the p-GaN layer 109, which shows a high resistance insulation characteristic of more than $\sim 10^6 \Omega$. Accordingly, in order to emit light during the recombination process of holes and electrons in the active layer 107, an activation process is essentially required to break the bond of Mg—H complex. Since the Mg-doped p-GaN layer 109 has a high resistance, it cannot be used without any change. The activation process is performed through an annealing process at a temperature range of 600° C.-800° C. in an ambient of $N_2$, $N_2/O_2$. However, since Mg existing in the p-GaN layer 109 has a low activation efficiency, it has a relatively high resistance value compared with the n-GaN layer 105 used as the first electrode contact layer. In real circumstance, after the activation process, the atomic concentration of Mg in the p-GaN layer 109 is in a range of $10^{19}/cm^3$-$10^{20}/cm^3$, and the hole carrier concentration contributing to a pure carrier conductivity is in a range of $10^{17}/cm^3$-$10^{18}/cm^3$, which correspond to a difference of maximum $10^3$ times. It is also reported that the hole mobility is 10 $cm^2$/vsec, which is a very low value. FIG. 2 is a schematic view showing a sectional structure of the conventional Mg-doped p-GaN layer and an Mg profile inside the Mg-doped p-GaN layer after the activation process is performed. Referring to FIG. 2, it can be seen that the Mg atomic concentration and the hole carrier concentration show a difference of maximum $10^3$ times.

Meanwhile, the Mg atomic concentration remaining in the p-GaN layer 109 without a complete activation causes many problems. For example, light emitting from the active layer toward the surface is trapped to lower the optical power, or when a high current is applied, heat is generated due to a relatively high resistance value, so that the life time of the light emitting device is shortened to have a fatal influence on the reliability. Especially, in the case of a large size/high power 1 mm×1 mm light emitting device using a flip chip technique, since a current of 350 mA which is very higher than a conventional current of 20 mA is applied, a junction temperature of more than 100° C. is generated at a junction face, having a fatal influence on the device reliability and causing a limitation to product application in future. The generated much heat is caused by an increase of resistance component due to the Mg atomic concentration remaining in the p-GaN layer 109 used as the second electrode contact layer without being activated as a carrier, and a rough surface property due to the increase of the resistance component.

Also, in the general p-/n-junction light emitting device, the n-GaN layer 105 used as the first electrode contact layer can easily control the hole concentration within $5-6 \times 10^{18}/cm^3$ within a critical thickness ensuring the crystallinity in proportional to the silicon doping concentration depending on an increase in the flow rate of $SiH_4$ or $Si_2H_6$, whilst in the p-GaN layer 109 used as the second electrode contact layer, the hole concentration substantially serving as carriers is limited within a range of $1-9\times10^{17}/cm^3$ although the flow rate of $Cp_2Mg$ is increased and Mg atoms of more than maximum $\sim10^{20}/cm^3$ are doped. To this end, the conventional light emitting device is made in a p-/n-junction structure having an asymmetric doping profile.

As aforementioned, the low carrier concentration and high resistance component of the p-GaN layer 109 used as the second electrode contact layer cause the light emitting efficiency to be decreased.

To solve the above problem, a conventional method for increasing the optical power by employing Ni/Au TM (transparent thin metal) having a good transmission and a low contact resistance has been proposed. However, the conventional method badly influences the device reliability when being applied to a large size/high power light emitting device. This problem still remains unsettled in the light emitting devices using the GaN semiconductor.

BRIEF SUMMARY

Technical Problem

The present invention provides a nitride semiconductor light emitting device and fabrication method thereof that can enhance the property of p-GaN layer constituting the nitride semiconductor light emitting device.

Also, the present invention provides a nitride semiconductor light emitting device and fabrication method thereof that can enhance the optical power and reliability.

In addition, the present invention provides a nitride semiconductor light emitting device and fabrication method thereof that can overcome the problems caused by the low hole carrier concentration and mobility of the Mg-doped p-GaN layer used as the second electrode contact layer and a high resistance component of Mg atomic concentration (including Mg—H complex) remaining completely inactivated in the p-GaN layer, and enhance the optical power and reliability.

Technical Solution

There is provided a nitride semiconductor light emitting device including: a first nitride semiconductor layer; an active layer formed above the first nitride semiconductor layer; and a delta doped second nitride semiconductor layer formed above the active layer.

In another aspect of the present invention, there is provided a nitride semiconductor light emitting device including: a buffer layer; a first nitride semiconductor layer formed above the buffer layer; a first electrode contact layer formed above the first nitride semiconductor layer; an active layer formed above the first nitride semiconductor layer in a single quantum well structure or a multi quantum well structure comprised of a well layer and a barrier layer; and a delta doped second nitride semiconductor layer formed above the active layer.

In another aspect of the present invention, there is provided a method of fabricating a nitride semiconductor light emitting device, the method including: forming a buffer layer above a substrate; forming a first nitride semiconductor layer above the buffer layer; forming an active layer above the first nitride semiconductor layer; and forming a delta doped second nitride semiconductor layer above the active layer.

Advantageous Effects

According to the present invention, the characteristic of the p-GaN layer constituting the nitride semiconductor light emitting device is enhanced, the optical power of the nitride semiconductor light emitting device is enhanced, the optical power down phenomenon is improved, and the reliability against ESD (Electro Static Discharge) is enhanced.

DESCRIPTION OF DRAWINGS

The spirit of the present invention will be understood more apparently from the accompanying drawings. In the drawings.

DETAILED DESCRIPTION

Best Mode

Hereinafter, an embodiment according to the spirit of the present invention will be described with reference to the accompanying drawings.

The present invention is characterized in that in the fabrication method of a nitride semiconductor, a $Cp_2Mg$ delta doping process is performed to grow a p-GaN layer, and the $Cp_2Mg$ delta doping process will be described with reference to FIGS. 3 to 5.

Figure 1:
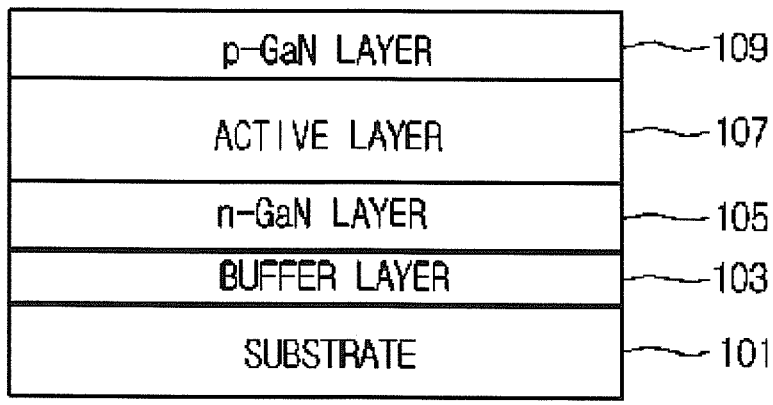
FIG. 1 is a schematic view showing a stack structure of a general nitride semiconductor light emitting device.
Figure 2:
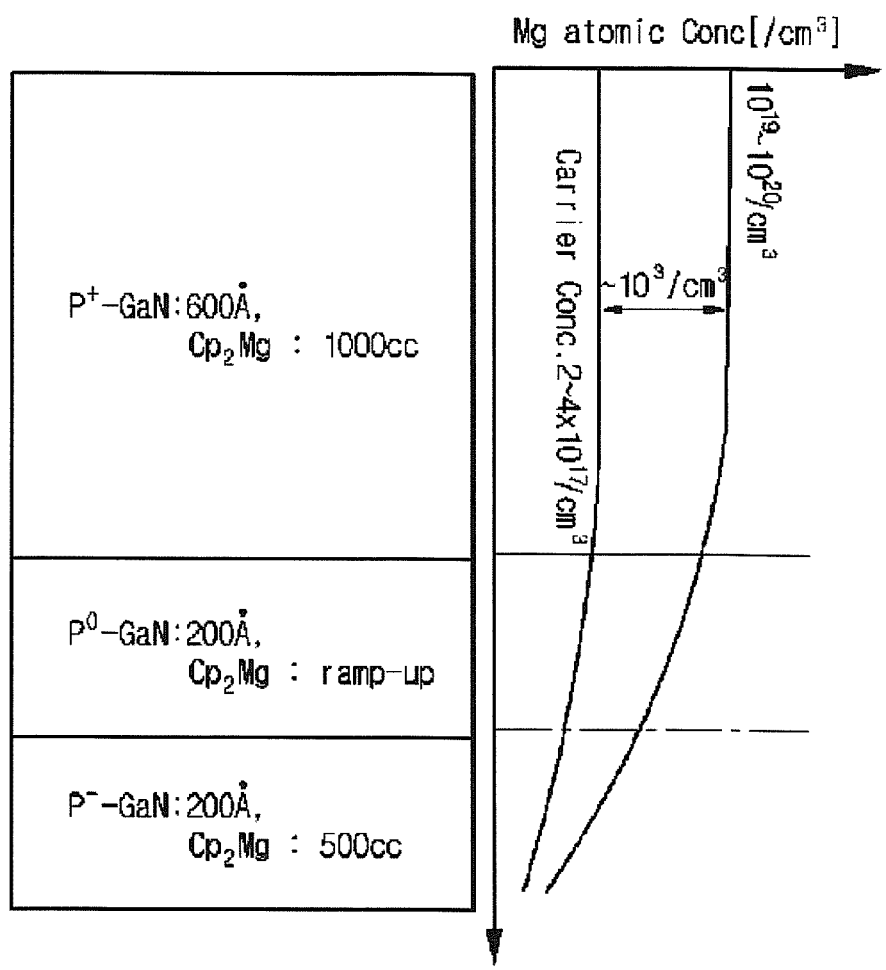
FIG. 2 is a schematic view showing a sectional structure of the conventional Mg-doped p-GaN layer and an Mg profile inside the Mg-doped p-GaN layer after the activation process is performed.
Figure 3:
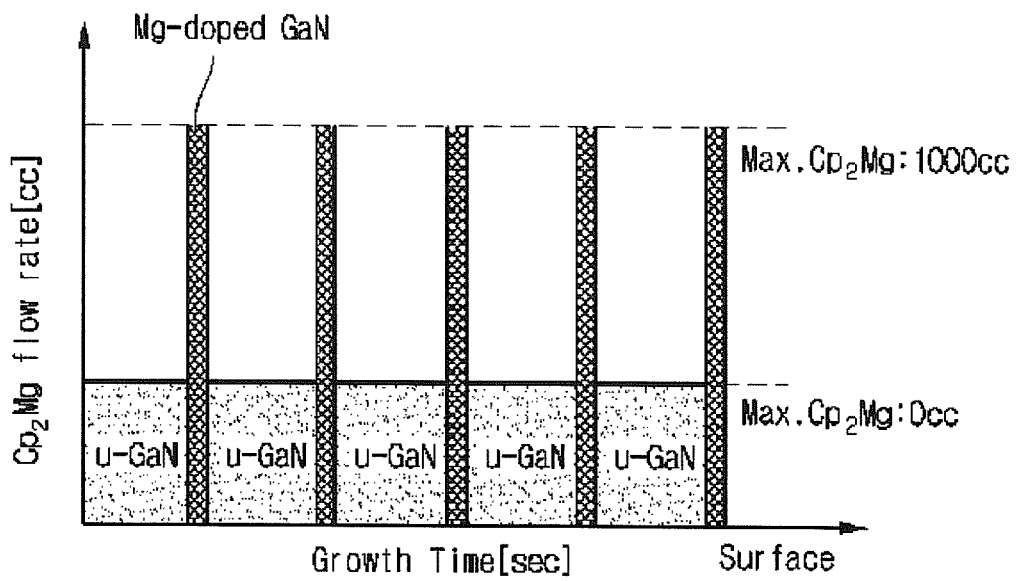
FIG. 3 is a schematic view illustrating a $Cp_2Mg$ delta doping flow rate according to a growth time.

FIG. 3 is a schematic view illustrating a $Cp_2Mg$ delta doping flow rate according to a growth time.

Referring to FIG. 3, after an active layer emitting light is grown, an undoped GaN layer of less than 200 Å is grown so as to protect a "V" pit defect formed during the growth of the active layer, and the flow rate of $Cp_2Mg$ is adjusted from 0 cc to 1000 cc within a thickness range of 10-200 Å to form a delta doped GaN layer. FIG. 3 shows an Mg-delta doped GaN grown by consecutively repeating one period consisting of undoped GaN layer/delta doped GaN layer. In the above crystal growth method, only the flow rate of $Cp_2Mg$ is changed, the growth temperature is fixed to 1000° C. and the other conditions are fixed so as to maintain the crystallinity.

In growing the Mg-delta doped GaN layer, the thickness of each of the undoped GaN layer and the delta doped GaN layer constituting one period may be varied. Also, in repeatedly growing one period of undoped GaN layer/delta doped GaN layer, the dose at each period may be varied. At this time, an overall thickness of the two layers forming one period can be adjusted within a thickness range of 10-300 Å.

Figure 4:
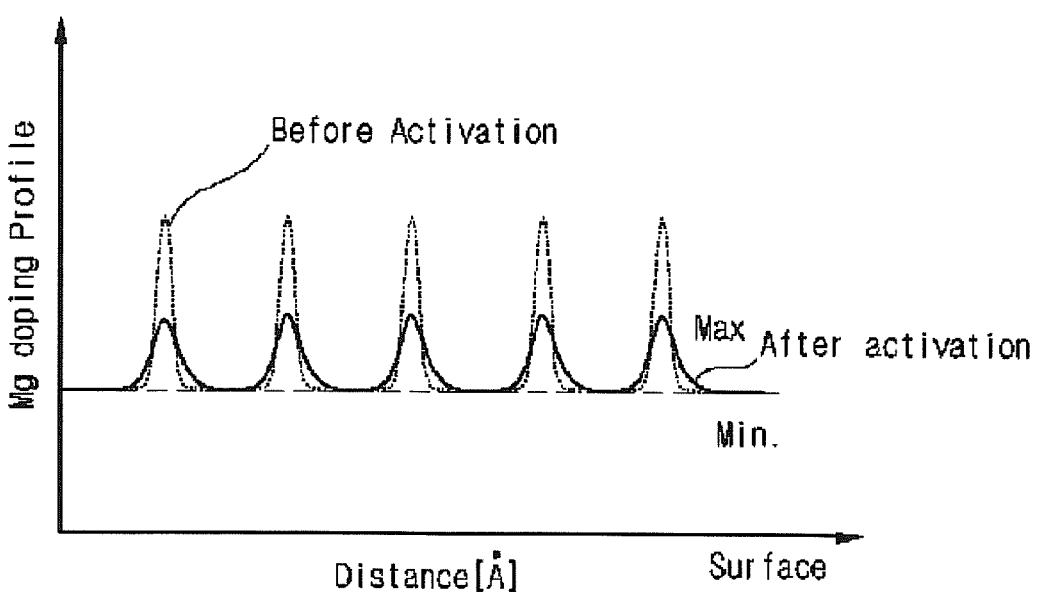
FIG. 4 is a graph showing an Mg doping profile before and after a subsequent activation process after a crystal growth for a $Cp_2Mg$ delta doped p-GaN is completed.

FIG. 4 is a graph showing an Mg doping profile before and after a subsequent activation process after a crystal growth for a Cp$_2$Mg delta doped p-GaN is completed.

Referring to FIG. 4, when Cp$_2$Mg delta doping of the same amount is repeated at a constant period before the subsequent activation process, the delta doped GaN layer having a sharp Mg doping profile can be obtained at a boundary between the undoped GaN layers. Thereafter, while the subsequent activation process is performed, Mg is diffused into the undoped GaN layers of both sides, so that a wide Mg doping profile is obtained. Through the above subsequent activation process, the p-GaN layer has a uniform Mg doping profile in whole.

In general, when a forward bias is applied to the undoped GaN layer, it can be seen that the operating voltage increases. In the present invention, the operating voltage can be effectively lowered to less than 3.5 V (20 mA) to increase the optical power of the light emitting device by controlling the thickness of the Cp$_2$Mg delta doped p-GaN layer and the thickness of the undoped GaN layer.

Figure 5:
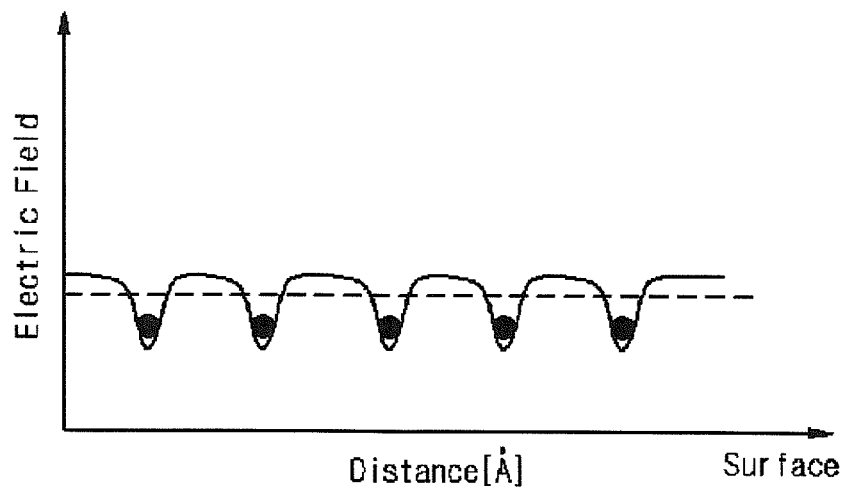
FIG. 5 is a graph showing an electric field profile after a subsequent activation process of a $Cp_2Mg$ delta doped p-GaN layer is completed.

FIG. 5 is a graph showing an electric field profile after a subsequent activation process of a Cp$_2$Mg delta doped p-GaN layer is completed.

Referring to FIG. 5, it can be seen that the hole carrier concentration profile is relatively high in the Cp$_2$Mg delta doped regions periodically repeated. Therefore, in the Cp$_2$Mg delta doped regions, potential increases to form an electric field doping. Accordingly, like in an HEMT structure 2 DEG (two dimensional electronic well layer) that is a high speed switching device using an energy bandgap difference (AlGaN/GaN junction), potential well can be formed to uniformly and effectively control the flow of holes likewise to effectively control a two-dimensional flow of electrons. In conclusion, it can be seen that hole injection efficiency is increased by the potential well.

As can be seen from the above description, the p-GaN layer grown by the conventional art has a problem that when a forward bias is applied, a high resistance component thereof sharply decreases current flow in inverse proportion with a distance from an electrode contact surface to an upper surface thereof, whilst in the present invention, the potential well layer can more effectively increase the current density to enhance the optical power of the light emitting device.

Also, by the Cp$_2$Mg delta doping, since the doping element is uniformly, repeatedly and periodically doped at a relatively very small amount and then the activation process for the p-GaN layer is optimized and performed, the atomic concentration of Mg, Mg—H complex and the like existing therein can be decreased to suppress the resistance component as much as possible. In other words, the present invention increases the hole carrier concentration purely contributing to the electric conductivity to thereby increase the recombination probability with electrons and in the long run effectively increase the optical power. Thus, the present invention provides a high level crystal growth technique that can decrease the resistance component to enhance the reliability of the light emitting device.

Hereinafter, a concrete embodiment of the nitride semiconductor light emitting device according to the present invention will be described.

Figure 6:
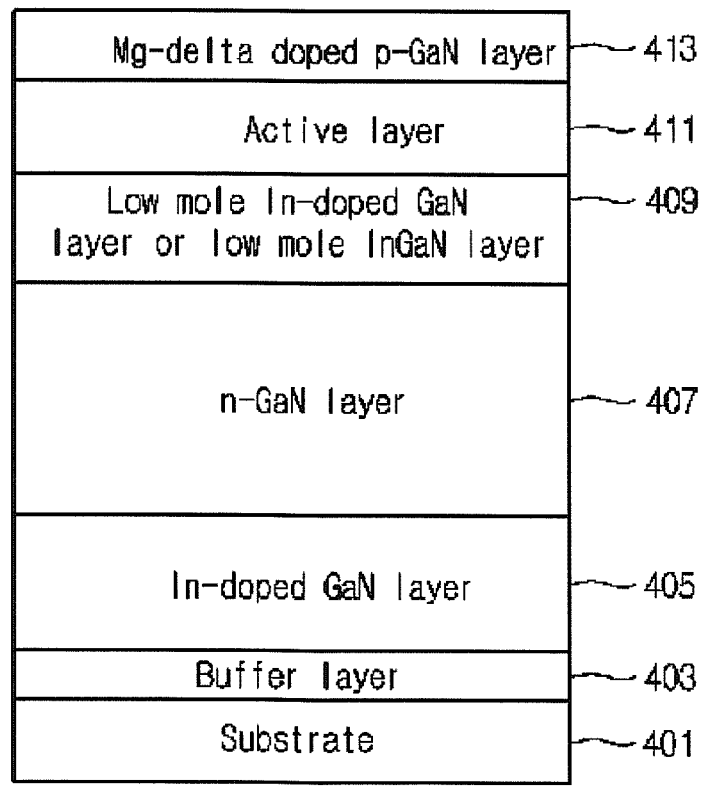
FIG. 6 is a schematic view showing a stack structure of a nitride semiconductor light emitting device according to a first embodiment of the present invention.

FIG. 6 is a schematic view showing a stack structure of a nitride semiconductor light emitting device according to a first embodiment of the present invention.

Referring to FIG. 6, the nitride semiconductor light emitting device according to the present embodiment includes a substrate 401, a buffer layer 403, an In-doped GaN layer 405, an n-GaN layer 407, a low-mole In-doped GaN layer or low-mole InGaN layer 409, an active layer 411, and an Mg-delta doped p-GaN layer 413. The Mg-delta doped p-GaN layer 413 has been described in detail with reference to FIGS. 3 to 5.

Hereinafter, a fabrication method of the nitride semiconductor light emitting device according to a first embodiment will be described in more detail.

First, in the present embodiment, only H$_2$ carrier gas is supplied onto the sapphire substrate 401 at a high temperature to clean the sapphire substrate 401. Thereafter, in step of decreasing the growth temperature to 540° C., NH$_3$ source gas is supplied to perform a nitridation of the sapphire substrate 401, for example for 7 minutes.

Thereafter, the buffer layer 403 having a $1^{st}$ AlInN/$1^{st}$ GaN/$2^{nd}$ AlInN/$2^{nd}$ GaN structure is grown to a thickness of about 500 Å. Herein, the buffer layer 403 can be formed in a structure selected from the group consisting of a stack structure of AlInN/GaN, a super lattice structure of InGaN/GaN, a stack structure of In$_x$Ga$_{1-x}$N/GaN, and a stack structure of Al$_x$In$_y$Ga$_{1-(x+y)}$N/In$_x$Ga$_{1-x}$N/GaN. Then, the growth temperature is increased up to 1060° C. for 6 minutes, the low temperature buffer layer 403 is recrystallized in a mixture ambient of NH$_3$ source gas and H$_2$ carrier gas for 2 minutes, and at the same growth temperature, the indium-doped GaN layer 405 having about 2 µm thickness is grown in a single crystal.

Thereafter, the growth temperature is decreased to 1050° C., and the n-GaN layer 407 co-doped with silicon and indium at the same growth temperature is grown to a thickness of 2 µm. The n-GaN layer 407 is used as the first electrode layer.

Also, to adjust the strain of the active layer 411, the low-mole In-doped GaN layer or low-mole InGaN layer 409 having 5% indium content (wavelength: 480 nm) is grown to a thickness of 300 Å at 750° C. The indium content can be adjusted in a range of 1-5%. The low-mole In-doped GaN layer or low-mole InGaN layer 409 is intentionally controlled in 'spiral growth mode' having a uniform profile. Herein, in the low-mole In-doped GaN layer or low-mole InGaN layer 409, as the 'spiral density' intentionally controlled increases, the area of the active layer 411 increases. Accordingly, the low-mole In-doped GaN layer or low-mole InGaN layer 409 can perform a role that can increase the light emitting efficiency.

Thereafter, at the same growth temperature, the active layer 411 having a single quantum well (SQW) of undoped InGaN/InGaN structure is grown. In the grown active layer 411, the barrier layer has an indium content of less than 5% and a thickness of about 250 Å. At this time, the active layer 411 can be formed in the multi quantum well layer.

Thereafter, the growth temperature is again increased to 1000° C., an overall thickness is fixed to 0.1 µm, the flow rate of TMGa is also fixed, and only the flow rate of Cp$_2$Mg is switched on/off from 0 cc to 1000 cc to thereby perform the delta doping process. In order to effectively perform the Cp$_2$Mg delta doping, after the active layer 411 emitting light is grown, the undoped GaN layer is first grown in a thickness range of 10-200 Å to completely protect the active layer 411 such that Mg atoms are not internally diffused into the "V" pit crystal formed on a surface of the active layer 411, and then the Cp$_2$Mg delta doping process is performed in a thickness range of 10-200 Å. The Cp$_2$Mg delta doping process sets the undoped GaN/delta doped GaN structure as one period and continuously repeats the one period within an overall thickness of 0.1 µm to form a light emitting device having a p-/n-junction structure such that resistance component is decreased by Mg atomic concentration (including Mg atomic and Mg—H complex) after the activation and uniform carrier concentration is obtained.

After the nitride semiconductor light emitting device is completed by the aforementioned processes, mesa etching is performed using an ICP etching apparatus and the nitride semiconductor light emitting device is made in a size of 330 μm×205 μm. Electrical property variation of the fabricated nitride semiconductor light emitting device is analyzed and investigated to verify its performance. As a result, the operating voltage (20 mA) in a forward bias is below 3.4 V, which is the same value as that of the conventional art, but the optical power is increased by 50-100%.

Why the optical power is increased is that an inner diffusion into the "V" pit defect formed in the surface of the active layer emitting light is suppressed, and an absolute amount of Mg atomic (including Mg—H complex) remaining in the layer after the subsequent activation process is decreased by an Mg doping profile lower than that of the conventional art, but the hole carrier concentration contributing to the electric conductivity is increased.

Figure 7:
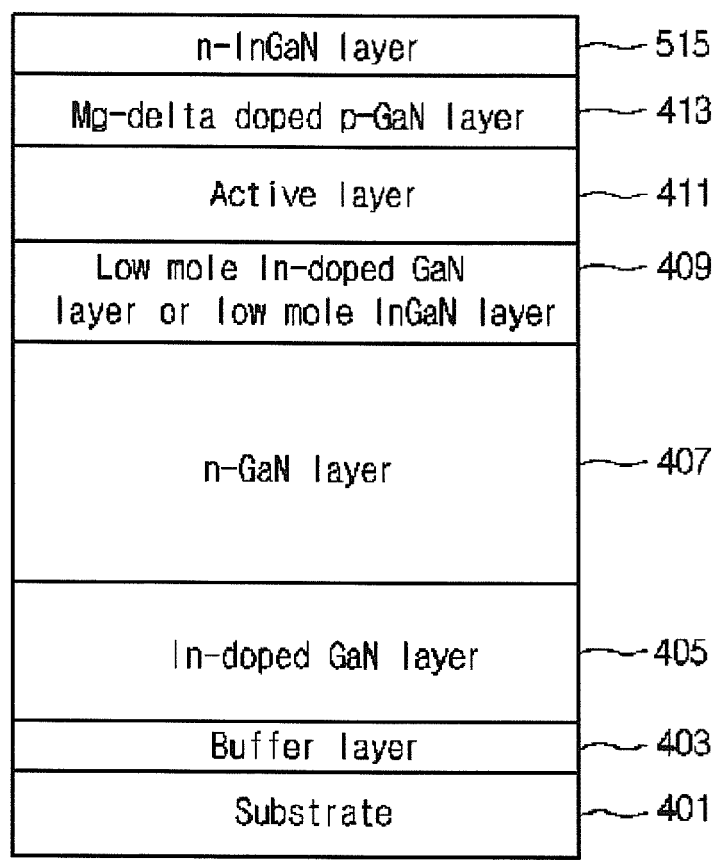
FIG. 7 is a schematic view showing a stack structure of a nitride semiconductor light emitting device according to a second embodiment of the present invention.

FIG. 7 shows a nitride semiconductor light emitting device according to a second embodiment of the present invention.

Referring to FIG. 7, the nitride semiconductor light emitting device according to a second embodiment of the present invention includes a substrate 401, a buffer layer 403, an In-doped GaN layer 405, an n-GaN layer 407, a low-mole In-doped GaN layer or low-mole InGaN layer 409, an active layer 411, an Mg-delta doped p-GaN layer 413, and an n-InGaN layer 515.

Compared with the first embodiment, the above second embodiment has a difference in that the nitride semiconductor light emitting device further includes the n-InGaN layer 515. Therefore, only the n-InGaN layer 515 will be additively described and descriptions of other elements will be referred from that of the first embodiment.

To fabricate an n-/p-/n-junction structure light emitting device, in addition to the p-/n-junction structure light emitting device, the second embodiment of the present invention grows the Mg-delta doped p-GaN layer 413 and then grows the n-InGaN layer 515 to use as the second electrode contact layer.

The n-InGaN layer 515 used as the second electrode contact layer is grown to a thickness of 50 Å with being doped with silicon at a growth temperature decreased to 800° C. in a mixture gas ambient of $NH_3$ source gas and $N_2$ carrier gas. At this time, the n-InGaN layer 515 is used as the second electrode contact layer and is designed to have the super grading (SG) structure in which indium content is adjusted to control the energy bandgap profile on whole. By the aforementioned method, the n-/p-/n-junction structure nitride semiconductor light emitting device can be obtained.

MODE FOR INVENTION

In addition to the above embodiments, a plurality of other examples can be provided on the basis of the same spirit.

First, a transparent electrode may be further formed on the n-InGaN layer 515. The transparent electrode can be formed of one selected from the group consisting of ITO, IZO(In—ZnO), GZO(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au, and Ni/$IrO_x$/Au/ITO.

Also, while the second embodiment illustrates that the n-InGaN layer 515 is formed as the second electrode contact layer, an n-InGaN/InGaN super latttice structure may be formed as the second electrode contact layer. Alternatively, a Si-doped GaN layer may be further formed between the n-InGaN/InGaN super lattice layer and the Mg-delta doped p-GaN layer 413.

In addition, the first and second embodiments illustrate that Mg is delta doped in the delta doping process. However, through a similar process, Mg—Al, Mg—Al—In or the like as well as Mg can be delta doped. At this time, TMAl, TMIn MO (metal organic) can be used as a doping source.

Further, the delta doped p-GaN layer can be formed with one period consisting of undoped AlGaN/delta doped p-GaN structure, the two layers constituting the one period can be repeatedly grown at least two times, the undoped AlGaN layer is grown within a thickness range of 10-300 Å with an Al composition range of 0.01-0.02.

Furthermore, the delta doped p-GaN layer can be formed with one period consisting of undoped InGaN/delta doped p-GaN structure, the two layers constituting the one period can be repeatedly grown at least two times, the undoped InGaN layer is grown within a thickness range of 10-300 Å with an Al composition range of 0.01-0.1.

Also, the delta doped p-GaN layer can be formed with one period consisting of undoped GaN/undoped AlGaN cap/delta doped p-GaN structure, the three layers constituting the one period can be repeatedly grown at least two times, the undoped AlGaN cap layer is grown within a thickness range of 5-200 Å with an Al composition range of 0.01-0.02.

Additionally, the delta doped p-GaN layer can be formed with one period consisting of undoped InGaN/undoped AlGaN cap/delta doped p-GaN structure, the three layers constituting the one period can be repeatedly grown at least two times, the undoped AlGaN cap layer is grown within a thickness range of 5-200 Å with an Al composition range of 0.01-0.02.

Also, in the first and second embodiments, the n-GaN layer serving as the first electrode contact layer can be an n-GaN layer formed by a co-doping of Si and In, and it can be formed at a doping concentration of $1\text{-}9\times10^{19}/cm^3$ in a thickness range of 1-4 μm.

Additionally, the first electrode contact layer can be formed with one period consisting of undoped-AlGaN/doped-GaN super lattice structure, the two layers constituting the one period can be repeatedly grown at least two times with an overall thickness of 1-2 μm and an Al composition of 0.05-0.3. The doped-GaN layer can be formed within a thickness range of 200-500 Å.

Further, the active layer can be made in a single quantum well structure or a multi quantum well structure comprised of well layer/SiNx cluster layer/barrier layer, and the SiNx cluster layer can be grown by a Si-delta doping method. The SiNx cluster layer can be grown by the Si-delta doping using a doping source of $SiH_4$ or $SiH_6$ alone.

INDUSTRIAL APPLICABILITY

According to the nitride semiconductor light emitting device and fabrication method thereof provided by the present invention, the optical power is enhanced, the power down phenomenon is improved, and the reliability against ESD (Electro Static Discharge) is enhanced.

Also, the present invention can be applied to a lighting apparatus requiring high optical power and high reliability.

What is claimed is:
1. A light emitting device comprising:
a first conductive type semiconductor layer;
an active layer on the first conductive type semiconductor layer; and
a second conductive type semiconductor layer on the active layer;

wherein the second conductive type semiconductor layer comprises a delta doped delta-doped p-type semiconductor layer on the active layer, wherein the delta-doped p-type semiconductor layer includes at least a first p-type nitride semiconductor layer near the active layer and at least a delta-doped second p-type nitride semiconductor layer that goes away from the active layer, and wherein the first conductive type semiconductor layer comprises a GaN layer and the delta doped second p-type nitride semiconductor layer comprises a GaN layer.

2. The light emitting device according to claim 1, wherein a dopant concentration of the delta-doped second p-type nitride semiconductor layer is higher than a dopant concentration of the first p-type nitride semiconductor layer.

3. The light emitting device according to claim 1, wherein the dopant concentration of the delta-doped second p-type nitride semiconductor layer is non-linearly decreased toward the first p-type nitride semiconductor layer.

4. The light emitting device according to claim 1, wherein the delta-doped second p-type nitride semiconductor layer has a maximum dopant concentration and the first p-type nitride semiconductor layer has a minimum dopant concentration.

5. The light emitting device according to claim 1, wherein the first conductive type nitride semiconductor layer further comprises a AlGaN layer.

6. The light emitting device according to claim 1, wherein the first conductive type nitride semiconductor layer further comprises a InGaN layer.

7. A light emitting device comprising:
a first conductive type semiconductor layer;
an active layer on the first conductive type semiconductor layer; and
a second conductive type semiconductor layer on the active layer,
wherein the second conductive type semiconductor layer comprises a delta doped p-type semiconductor layer on the active layer,
wherein the second conductive type semiconductor layer includes a p-type dopant, and
wherein the second conductive type semiconductor layer has a doping profile comprising a plurality of peaks.

8. The light emitting device according to claim 7, wherein the second conductive type semiconductor layer comprises a p-type GaN layer and a p-type AlGaN layer, and
wherein the plurality of peaks are disposed in the p-type GaN layer.

9. A light emitting device comprising:
a first nitride semiconductor layer;
an active layer on the first nitride semiconductor layer;
a second nitride semiconductor layer on the active layer; and
wherein the active layer includes a quantum well structure for emitting light,
wherein the first nitride semiconductor layer includes a super lattice structure having at least two layers, and
wherein the second nitride semiconductor layer includes a p-type impurity, the p-type impurity having a doping profile, and
wherein the second nitride semiconductor layer comprises a p-type Al GaN layer and the p-type AlGaN layer includes Mg—Al—In.

10. The light emitting device according to claim 9, wherein the doping profile comprises a first doping portion that has a minimum doping concentration and a second doping portion that has a maximum doping concentration.

11. The light emitting device according to claim 10, wherein the first doping portion is near the active layer and the second doping portion goes away from the active layer.

12. The light emitting device according to claim 10, wherein the doping profile has a curve that non-linearly decreases from the maximum doping concentration to the minimum doping concentration.

13. The light emitting device according to claim 10, wherein the first doping portion and the second doping portion have the same dopants.

14. The light emitting device according to claim 10, wherein the doping profile has a wide doping profile obtained by that dopants are diffused from the second doping portion to the first doping portion.

15. The light emitting device according to claim 9, wherein the first conductive type semiconductor layer comprises an n-GaN layer formed by a Si—In simultaneous doping.

16. The light emitting device according to claim 9, wherein the second nitride semiconductor layer further comprises a p-type GaN layer and
wherein p-type dopant of at least one portion of the p-type GaN layer is more heavily doped than p-type dopant of the p-type AlGaN layer.

17. The light emitting device according to claim 9, wherein the first nitride semiconductor layer comprises at least two times AlGaN/GaN super lattice structure of at least two layers.

18. The light emitting device according to claim 9, wherein the second nitride semiconductor layer has the doping profile comprising a plurality of peaks.

19. The light emitting device according to claim 18, wherein the second nitride semiconductor layer further comprises a p-type GaN layer, and
wherein the plurality of peaks are disposed in the p-type GaN layer.

* * * * *